United States Patent [19]

Morong, III

[11] Patent Number: 4,490,671
[45] Date of Patent: Dec. 25, 1984

[54] APPARATUS AND METHOD FOR DETERMINING THE NUMBER OF TURNS ON A SAMPLE COIL

[76] Inventor: William H. Morong, III, 97 Dalby St., Newton, Mass. 02158

[21] Appl. No.: 432,147

[22] Filed: Jan. 17, 1983

[51] Int. Cl.³ .................. G01R 31/02; G01R 31/06
[52] U.S. Cl. .................................................. 324/55
[58] Field of Search ................ 324/55, 117, 127, 51

[56] References Cited

U.S. PATENT DOCUMENTS

| | | | |
|---|---|---|---|
| 1,972,243 | 9/1934 | Nolke | 324/55 |
| 2,914,729 | 11/1959 | Thompson | 324/55 |
| 3,701,008 | 10/1972 | Kusters | 324/55 |
| 4,241,306 | 12/1980 | Bump | 324/55 |
| 4,439,724 | 3/1984 | Morong | 324/55 |

OTHER PUBLICATIONS

Moore: "Direct Reading Ratio-Error . . . of Current Transformers", IEEE Trans. on Inst. & Meas.-vol. IM-19, No. 3, Aug. 1970, pp. 161-166.

Primary Examiner—Stanley T. Krawczewicz
Assistant Examiner—Jose M. Solis
Attorney, Agent, or Firm—Irving M. Kriegsman

[57] ABSTRACT

An apparatus and method for determining the number of turns on a sample coil are disclosed. An alternating current of substantially constant amplitude is passed through a primary winding turn which is coupled to the sample coil and also through a primary winding turn which is coupled to a standard coil of known turns count, inducing currents in the sample coil and in the standard coil in inverse proportion to their respective turns counts. These induced currents are commutated into pulsating direct currents that are fed into a ratiometric current meter. This meter produces a measurement output corresponding to the ratio of the current induced in the standard coil to the current induced in the sample coil. This measurement output is displayed on a calibrated readout device as an indication of the number of turns on the sample coil. In addition, means are provided for indicating coil discontinuity and inverted coil phase.

9 Claims, 5 Drawing Figures

APPARATUS AND METHOD FOR DETERMINING THE NUMBER OF TURNS ON A SAMPLE COIL

FIELD OF THE INVENTION

This invention relates to an apparatus and method for determining the number of turns on an electrical coil. More particularly, this invention relates to such apparatus, operable by relatively unskilled personnel, for determining accurately and rapidly coil turns count.

BACKGROUND OF THE INVENTION

The manufacture of inductors, transformer windings, and the coils of other electromagnetic devices commonly requires close control of coil turns count. Such coils are often referred to as windings whether produced by a winding process or not. Coils are produced both manually and by machine, but in either procedure coils of incorrect turns count are often produced. It is always tedious and often impossible to ascertain coil turns count by visual inspection. Therefore, both coil manufacturers and their customers need to check coil turns count, especially for applications where the apparatus incorporating the coils will malfunction unless coil turns count is exactly as specified. It is often imperative to test completed coils for specified turns count. It is often desirable to monitor coil turns count during manufacture to facilitate application of the correct number of turns.

DESCRIPTION OF THE PRIOR ART

Various apparatus has been employed hitherto for coil turns count determination. Such prior art apparatus has generally not been satisfactory. For example, coil resistance measuring devices have failed to indicate reliably coil turns count because of variations in the total length of conductor applied to form a coil of the specified number of turns and because of variations in conductor resistivity.

In attempts to overcome this difficulty, coil turns checkers have been devised in which a single turn primary is inserted through the magnetic core of the sample coil, to determine the coil turns count by voltage transformer action. Such devices have suffered from inaccuracies resulting from the effects of contact resistances in series with the inserted primary.

In efforts to solve this problem some prior art turns checkers add a single turn secondary to be inserted along with the single turn primary through the magnetic core of the sample coil. U.S. Pat. No. 2,914,729 discloses such apparatus. The use of such apparatus to check coils wound on cores having core windows of small size or tortuous configuration is often precluded by the mechanical size and rigidity of the single turn primary and secondary arrangement.

U.S. Pat. No. 2,914,729 further discloses the use of a calibrated variable resistor as the variable element used to seek a voltage null as a necessary measurement condition. Such an arrangement is expensive, difficult to maintain in calibration and prone to mechanical wear.

The turns count determining apparatus disclosed in U.S. Pat. No. 2,921,255 and in U.S. Pat. No. 3,953,791 is limited to operation with sample coils having open magnetic circuits, being prevented by the self shielding action of closed cores from coupling with coils wound thereupon.

The electrical testing apparatus disclosed in U.S. Pat. No. 2,788,486 does not determine turns count, but indicates the presence of short circuits in sample coils.

SUMMARY OF THE INVENTION

In accordance with the present invention, an apparatus is provided for determining the number of turns of a sample coil. A primary winding turn is coupled to the sample coil. A standard coil wound on a magnetic core and provided with a primary winding turn forms a reference current transformer. The primary winding turn coupled to the sample coil is driven in series circuit with the primary winding turn of the standard coil by an alternating current source of substantially constant amplitude inducing thereby currents in the standard coil and in the sample coil, these currents being inversely proportional to the numbers of turns of their respective coils. The induced currents in both coils are fed into a current commutator where they are converted to pulsating direct currents corresponding to the induced currents from which they are derived. These pulsating direct currents are fed into a ratiometric current meter that produces a measurement output corresponding to the ratio of the induced current in the standard coil to that in the sample coil, thereby indicating the number of turns on the sample coil.

One object of the present invention is to provide a coil turns count checker that is capable of accurate turns count determination of sample coils.

Another object of this invention is to provide a coil turns count checker that utilizes inexpensive and durable solid state electronic components rather than expensive wear-prone electro-mechanical components to perform its measurement function.

Still another object of this invention is to provide a coil turns count checker that depends on both electrical and magnetic coupling to the sample coil rather than magnetic coupling alone, so that coils with either open or closed magnetic circuits can be measured.

Another object of this invention is to provide a coil turns count checker that indicates discontinuity of the sample coil.

Yet another object of this invention is to provide a coil turns count checker that indicates incorrect poling of the sample coil.

Other objects, aspects and advantages of the invention will in part be pointed out, and in part apparent from, the following description of a preferred embodiment of the invention, considered together with the accompanying drawings.

DESCRIPTION OF A PREFERRED EMBODIMENT

Figure 1:
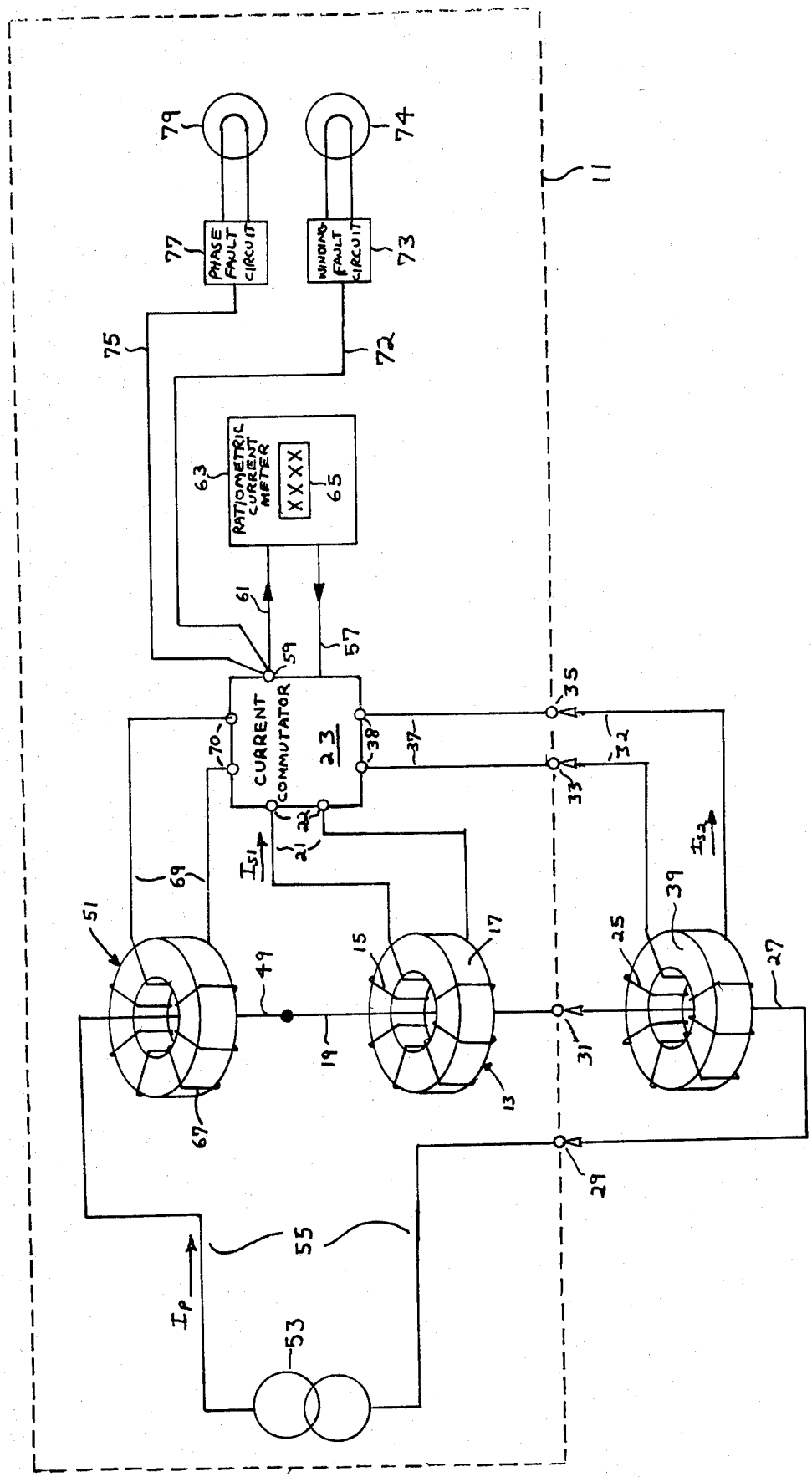
FIG. 1 is a diagrammatic representation illustrating an embodiment of the invention along with and connected to a sample coil whose turns count is to be determined, the coil being mounted on a closed magnetic core.

Referring first to FIG. 1, there is shown an embodiment of an apparatus constructed according to the teachings of the present invention and identified by reference numeral 11. Apparatus 11 includes a transformer 13 which is made up of a standard coil 15 (i.e. having a known number of turns) which is wound upon a core 17 with a primary winding turn 19 coupled thereto. The passage of a turn through the window of a core suffices to assure coupling whether or not that turn appears to be wound upon its core. The coil 15 is connected by a pair of leads 21 to a first pair of input terminals 22 of a current commutator 23.

A sample coil 25, whose turns count is to be determined, is magnetically coupled to a primary winding turn 27. In order for the apparatus 11 to operate it is necessary that the sample coil 25 be magnetically coupled to the turn 27 so that they may cooperate during the turns count determination to form a transformer. It is of no consequence to the operation of the apparatus 11 whether or not the sample coil 25 possesses a magnetic core or an air core as long as it is capable of being penetrated by a magnetic circuit which can be closed through it and around the turn 27. The turn 27 is connected to the apparatus 11 through a pair of terminals 29 and 31. The coil 25 is connected by a pair of leads 32 to a pair of terminals 33 and 35 which are connected by a second pair of leads 37 to a second pair of input terminals 38 in commutator 23. As can be seen, the coil 25 is magnetically coupled to the turn 27 by a closed magnetic core 39 upon which the coil 25 is wound.

Figure 3:
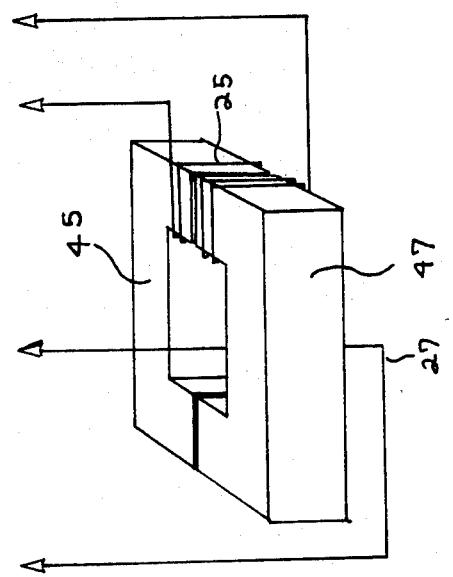
FIG. 3 is a diagrammatic representation of another sample coil whose turns count may be determined according to the present invention, the sample coil in this figure being coupled to a closed magnetic circuit including two open cores.
Figure 2:
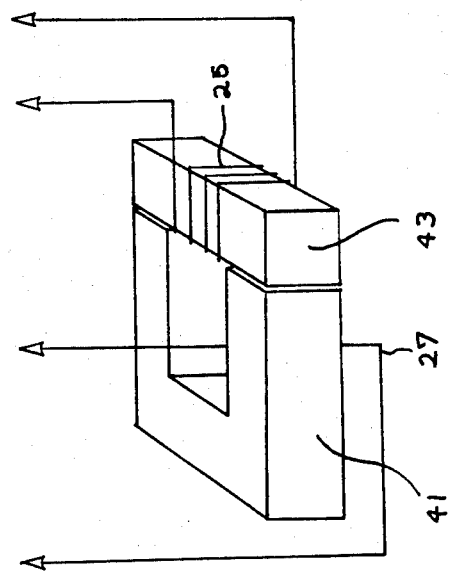
FIG. 2 is a diagrammatic representation of another sample coil whose turns count may be determined according to the present invention, the sample coil in this figure being coupled to a closed magnetic circuit including a single open core.

As can be appreciated, the sample coil 25 need not be coupled to primary winding turn 27 by a closed magnetic core 39. For example, in FIG. 2, there is shown a sample coil 25 which is coupled to the turn 27 by a closed magnetic circuit including an open core 41 placed about the turn 27 and an open core 43 upon which the sample coil 25 is wound. As another example, in FIG. 3 there is shown a sample coil 25 which is coupled to the turn 27 by a closed magnetic circuit including two open cores 45 and 47 placed about the turn 27 and through the coil 25.

The turns 27 and 19 and the primary winding 49 of a synchronizing transformer 51 are connected in series circuit with one another and with an alternating current source 53 that energizes a loop 55 thus formed with a common primary current. This alternating current induces currents in the coils 15 and 25 that are inversely proportional to their respective numbers of turns. That is in general:

$$Is_1 = Ip \cdot \frac{Np_1}{Ns_1} \quad (1)$$

and $$Is_2 = Ip \cdot \frac{Np_2}{Ns_2} \quad (2)$$

where:

Ip is the primary current.
$Is_1$ is the current of the standard coil.
$Ns_1$ is the turns count of the standard coil.
$Np_1$ is the number of primary turns coupled to the standard coil.
$Is_2$ is the current of the sample coil.
$Ns_2$ is the turns count of the sample coil.
$Np_2$ is the number of primary turns coupled to the sample coil.

Since the primary turn of each coil receives identical current it will be clear from equations (1) and (2) that the following relationship has been established:

$$Ns_2 = \frac{Np_2}{Np_1} \cdot \frac{Is_1}{Is_2} \cdot Ns_1 \quad (3)$$

Accordingly the number of turns of the unknown coil will be given by:

$$Ns_2 = K \cdot \frac{Is_1}{Is_2} \quad (4)$$

where K is a known constant.

A timing signal input to the commutator 23 over a line 57 directs the commutator 23 to respond to either the coil 15 or the coil 25. The commutator 23 produces at an output 59 a pulsating direct current corresponding in magnitude to the amplitude and in polarity to the phase of the current of the particular coil to which the commutator 23 has been directed. The current from the output 59 is connected by a line 61 to the input of a ratiometric current meter 63. The current meter 63 produces the timing signal (that is connected to commutator 23 over line 57) which directs the commutator 23 to present at its output 59 a current corresponding to a current $Is_1$ in the coil 15 or a current $Is_2$ in the coil 25. The current meter 63 also produces a measurement output that corresponds to the ratio of the current $Is_1$ of the coil 15 to the current $Is_2$ of the coil 25. This measurement output is displayed in digital format on a display 65 on the current meter 63 to indicate directly the number of turns $Ns_2$ of the coil 25 in accordance with equation (4).

The current of the loop 55 induces in the secondary winding 67 of the synchronizing transformer 51 a current that is fed through a pair of lines 69 to a third set of input terminals 70 in the commutator 23. This current phase-senses the commutator 23 to make it essentially exclusively responsive to the non-reactive component of current in the coil to which it has been directed. Phase sensing the commutator 23 minimizes errors that otherwise would result from variations of winding configuration and core properties.

The output 59 of the commutator 23 is also connected by a line 72 to the input of a winding fault circuit 73 that responds to the absence of output current from the commutator 23 during the time when it is responsive to the sample coil 25 by illuminating a lamp 74 coupled thereto to visibly indicate any electrical discontinuity in the sample coil 25 or the connections thereto.

The output 59 of the commutator 23 is also connected by a line 75 to the input of a phase fault circuit 77 that responds to the reversal of output current from the commutator 23 during the time when it is responsive to the sample coil 25 by illuminating a lamp 79 coupled thereto to visibly indicate incorrect poling of the coil 25.

Figure 4:
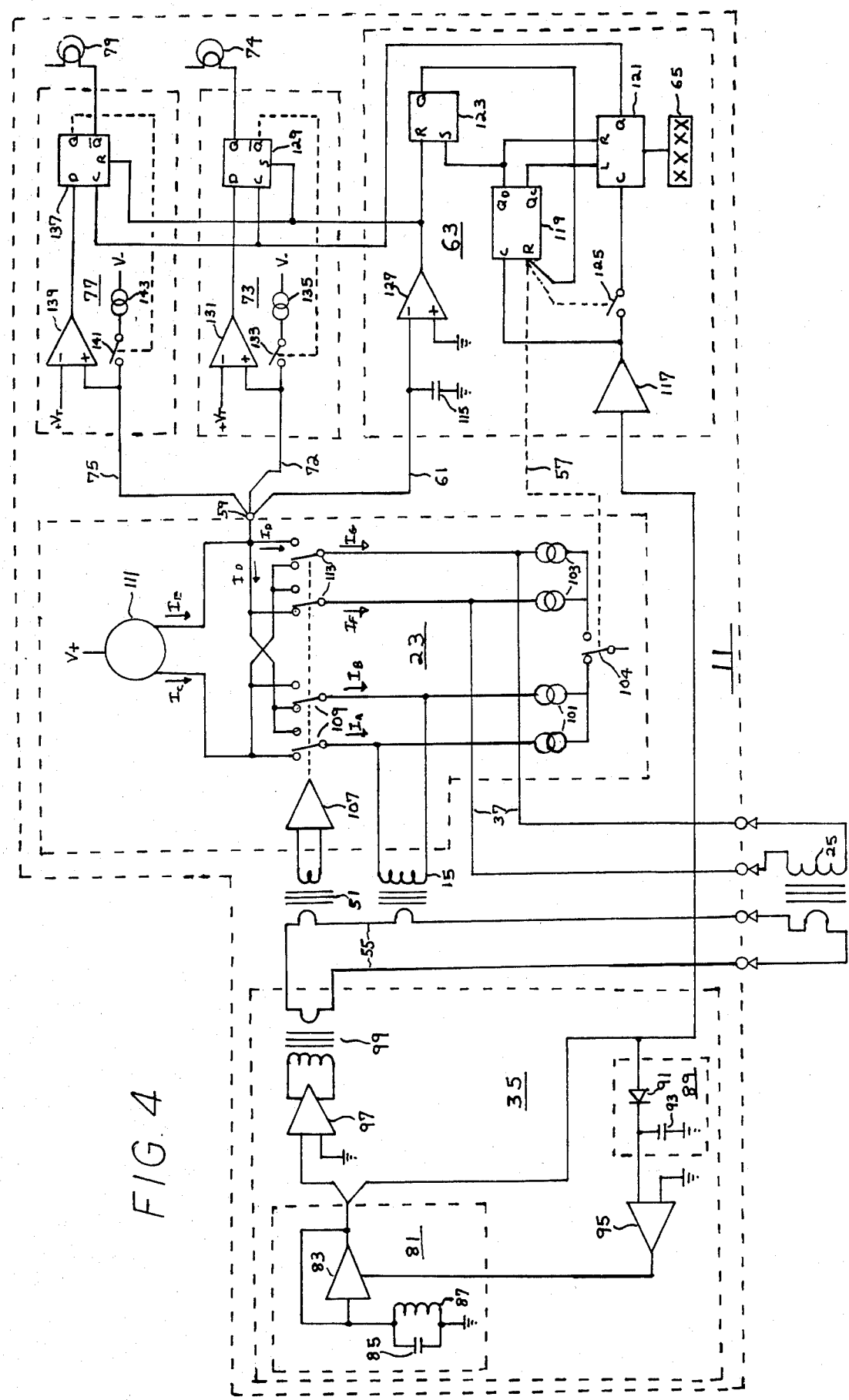
FIG. 4 is a simplified schematic diagram of an embodiment of the apparatus illustrated in FIG. 1.

FIG. 4 shows a simplified schematic diagram of the embodiment of the invention illustrated in FIG. 1. The alternating current source 35 comprises an oscillator circuit 81 which includes an amplifier 83 to provide gain and a frequency determining circuit comprising a capacitor 85 and an inductor 87. An output signal from oscillator 81 is rectified and filtered by a half-wave rectifier circuit 89 comprising a diode 91 and a capacitor 93. When the signal is large enough to make the diode 91 conduct a voltage appears across the capacitor 93. That voltage is amplified by an amplifier 95 which in turn acts upon the amplifier 83 to reduce its gain thus stabilizing the output signal of oscillator 81 at a peak voltage equal to the forward voltage drop of the diode 91. The output signal of oscillator 81 also feeds a differential amplifier 97 that has a high output impedance. This high output impedance makes the output current of amplifier 97 essentially independent of load. A drive transformer 99 reflects through its turns ratio the differential output current of the amplifier 97 to provide an alternating current that excites the loop 55.

The current commutator 23 includes two pairs of essentially equal current sources 101 and 103 which are alternately selected by a switch 104 in response to the timing signal on line 57. When the commutator 23 is directed to respond to the coil 15 the current source pair 101 is selected. The current of the coil 15 unbalances the currents $I_A$ and $I_B$ of current source pair 101. The unbalance corresponds in magnitude and phase to the current in coil 15. A synchronizing amplifier 107 intensifies the current of the synchronizing transformer 51 to toggle a switch quad 109 at oscillator 81 frequency and in phase with the real component of current in loop 55. Switch quad 109 converts the alternating current unbalance of $I_A$ and $I_B$ into a pulsating direct current unbalance of the currents $I_C$ and $I_D$. A current mirror 111 inverts the current $I_C$ to an equal current $I_E$ which is subtracted at output 59 from the current $I_D$, causing to flow out from the output 59 a pulsating direct current whose polarity and magnitude correspond to the phase and magnitude of the alternating current in coil 15.

Similarly, when the commutator 23 is directed to respond to the coil 25 current source pair 103 is selected and coil 25 unbalances the currents $I_F$ and $I_G$ which are converted in switch quad 113 to pulsating direct currents $I_C$ and $I_D$. Again current $I_C$ is inverted by current mirror 111 to generate current $I_E$ which is subtracted from current $I_D$ at the output 59, causing to flow into the output 59 a pulsating direct current whose polarity and magnitude correspond to the phase and magnitude of the alternating current in coil 25. Note that with a correctly poled coil 25 the direction of the current at the time when current source pair 103 is selected is into output 59, which is opposite to the direction of flow when current source pair 101 is selected.

The ratiometric current meter 63 includes a capacitor 115 which is positively charged by the current flowing out of output 59 over line 61 during the time commutator 23 is responsive to coil 15. A signal from oscillator 81, squared by a squaring comparator 117, clocks a divide-by-one-thousand counter 119 that counts upward at this time. Between counts 400 and 800 a latch in a counter 121 is updated by a Qc output of counter 119. Between the counts of 800 and 1000 the counter 121 is reset to zero by a Qd output of counter 119. At the count of 1000 the Qd output of counter 119 sets a flip-flop 123 that in turn holds at zero count the counter 119, enables counter 121 to count, turns on a switch 125 to admit clock pulses to counter 121, and changes the state of the timing signal on line 57 redirecting commutator 23 to respond to coil 25.

If coil 25 is connected correctly a current will now be drawn into the output 59 of commutator 23 causing the capacitor 115 to be discharged towards zero. While capacitor 115 is being discharged, counter 121 is counting upward, which continues until the voltage across capacitor 115 reaches zero volts. At zero volts a comparator 127 resets flip-flop 123, opening switch 125 and denying clock pulses to counter 121, allowing counter 119 to again count upward, and redirecting commutator 23 to coil 15. Thus a new cycle as described above is begun, during which the latches in counter 121 will be updated to allow output information to flow through decoders and drivers included in counter 121 to the display 65.

The ratiometric current meter 63 was described above as having a cycle consisting of two portions during one of which the capacitor 115 was charged in a positive slope and during the other of which the capacitor 115 was discharged in a negative slope. The current meter 63, therefore, is a form of analog-to-digital converter known as a dual slope integrator. Other similar devices have additional slopes for various zeroing functions within individual converters. These converters and the dual slope integrator may be classed together as multiple slope integrators. Several multiple slope integrators are commercially available as integrated circuits. One, the Intersil ICL 7106, is known to be adaptable to perform the function of ratiometric current meter 63, but that adaptation is considerably more complex than the more basic and completely workable dual slope integrator explained above.

The winding fault circuit 73 includes a type D flip-flop 129 that is clocked whenever counter 121 of current meter 63 counts more than 9999 counts and overflows. If at this count the voltage on the capacitor 115 of the current meter 63 has not exceeded the positive voltage left thereupon during the time when the commutator 23 was directed to respond to the coil 15, due to a lack of current from coil 25 through commutator 23, that voltage will be more minus than the threshold voltage $+Vt$, causing a logical zero to appear on the output of a comparator 131. That zero is clocked through flip-flop 129, illuminating the lamp 74 to indicate a winding fault and also closing a switch 133, connecting a current source 135 through lines 72 and 61 to capacitor 115 to discharge it to zero volts. At zero volts the flip-flop 129 is set by the comparator 127 and a new current meter cycle is begun.

The phase fault circuit 77 includes a type D flip-flop 137 that is clocked whenever counter 121 of current meter 63 counts more than 9999 counts and overflows. If at this count the voltage on capacitor 115 of the current meter 63 has risen above the positive voltage left thereupon during the time when commutator 23 was directed to respond to coil 15, due to a reversal of current from the coil 25, through commutator 23, that voltage will be more positive than the threshold voltage $+Vt$, causing a logical one to appear on the output of a comparator 139. This logical one is clocked through the flip-flop 137, illuminating the lamp 79 to indicate a phase fault and also closing a switch 141, connecting a current source 143 through lines 75 and 61 to capacitor 115 to discharge it to zero volts. At zero volts the flip-flop 137 is reset by the comparator 127 and a new current meter cycle is begun.

Figure 5:
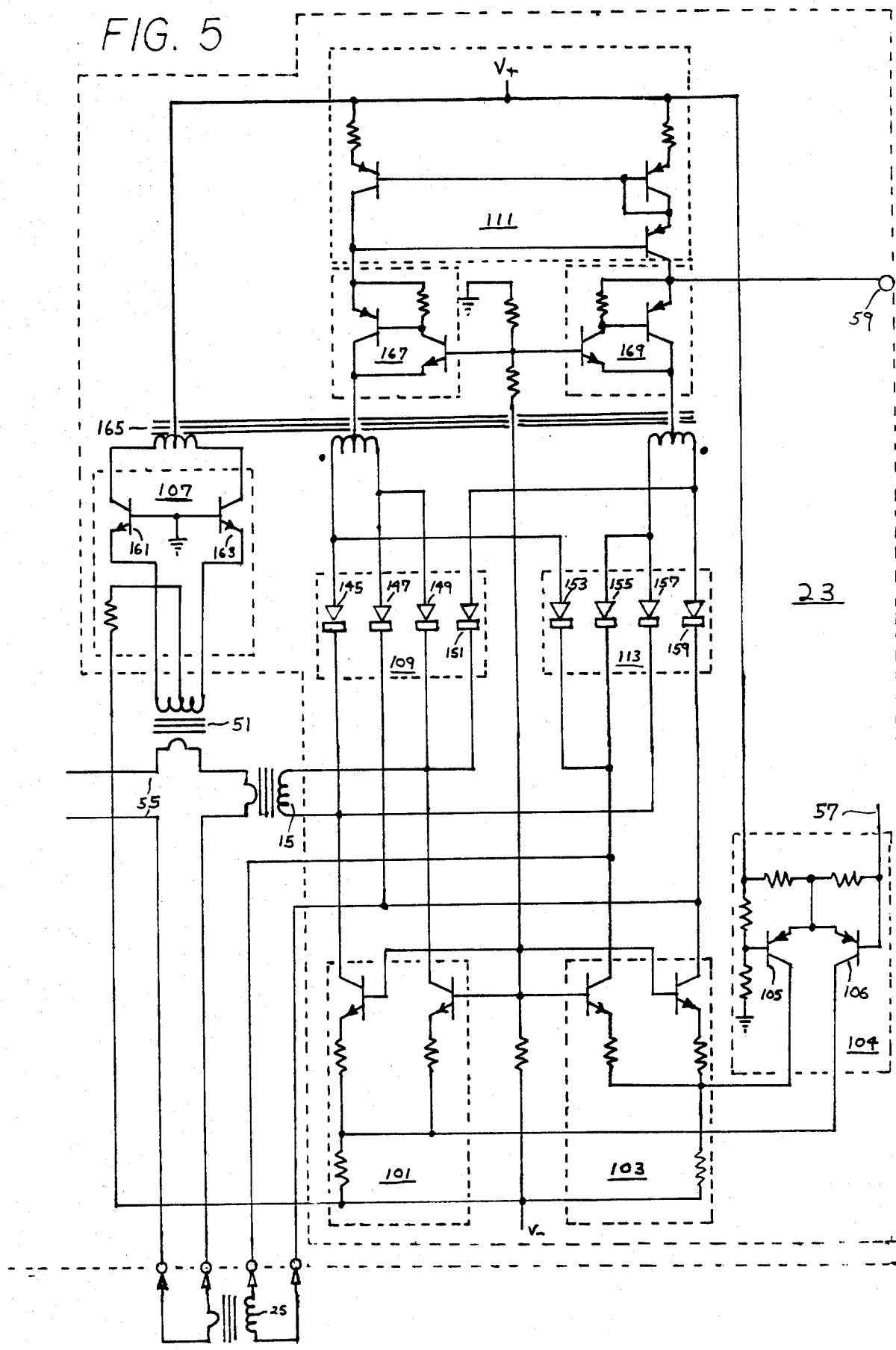
FIG. 5 is a schematic diagram showing details of an embodiment of the current commutator shown in FIG. 4 connected in operative manner to a standard coil and a sample coil whose turns count is to be determined.

FIG. 5 shows a detailed schematic diagram of the current commutator 23 portion of the invention illustrated in FIG. 1 operatively connected to the sample coil 25 and to the standard coil 15. The switch 104 comprises a differential amplifier of conventional character including transistors 105 and 106 for alternately selecting the current source pair 101 or the current source pair 103 in response to the signal on the line 57.

The two switch quads 109 and 113 comprise diodes 145, 147, 149, and 151 that commutate the current unbalance of the coil 15 while current source pair 101 is on, and diodes 153, 155, 157, and 159 that commutate the unbalance of coil 25 while current source pair 103 is on.

The synchronizing amplifier 107 comprises a differentially connected pair of emitter driven transistors 161 and 163 that are fed by synchronizing transformer 51. A drive transformer 165 provides electrically isolated multiple drives of sufficient intensity to toggle the switch quads 109 and 113 in synchrony with the current in loop 55.

Cascode amplifiers 167 and 169 of generally conventional character provide the low impedance differential voltage necessary for proper commutation of the switch quads 109 and 113 while passing essentially unattenuated the currents of said switch quads to the current mirror 111.

The current mirror 111 of generally conventional character converts the differential currents Ic and Id to the single-ended current output 59.

Although a specific preferred embodiment of the invention has been disclosed herein in detail, it is to be understood that this is for the purpose of illustrating the invention, and should not be construed as necessarily limiting the scope of the invention, since it is apparent that many changes can be made to the disclosed structure by those skilled in the art to suit particular applications.

What is claimed is:

1. Apparatus for determining the number of turns of a sample coil comprising:
    a primary winding turn adapted to be coupled to said sample coil;
    a reference current transformer comprising a core, a standard coil with a predetermined number of turns wound on the core and a primary winding turn also wound thereupon;
    means for connecting the primary winding turn of said reference current transformer and the primary winding turn of said sample coil in a series circuit loop;
    means for supplying alternating current of substantially constant amplitude to said circuit loop whereby alternating currents are induced to flow in said standard coil and in said sample coil, said alternating currents being inversely proportional to the numbers of turns of their respective coils;
    current commutator means coupled to said sample coil and said standard coil for converting the alternating current of said standard coil into a first pulsating direct current and for converting the alternating current of said sample coil into a second pulsating direct current;
    ratiometric current meter means coupled to the current commutator means for receiving said first pulsating direct current and said second pulsating direct current and producing therefrom a measurement output corresponding to the ratio of said first pulsating direct current to said second pulsating direct current, said ratio corresponding to the ratio of the number of turns on the sample coil to the number of turns on the standard coil, to indicate the turns count of said sample coil.

2. The apparatus of claim 1 and further including synchronizing means for forcing commutation to occur in synchrony with a phase reference signal.

3. The apparatus of claim 1, wherein said ratiometric current meter means includes a digital readout for presenting the measurement output in digital format.

4. The apparatus of claim 1, wherein said ratiometric current meter means comprises a multiple slope integrator.

5. The apparatus of claim 1, and further including means connected to said current commutator means responsive to the absence of current in said sample coil for indicating the presence of an electrical discontinuity in said sample coil.

6. The apparatus of claim 1, and further including means connected to said current commutator means responsive to the reversal of current in said sample coil for indicating incorrect poling of said sample coil.

7. A method of determining the turns count of a sample coil wound on a closed magnetic core comprising the steps of:
    exciting a first primary winding turn passed through the window of said magnetic core with an alternating current,
    exciting a second primary winding turn coupled to a standard coil wound on a magnetic core with said current,
    producing a measurement output proportional to the ratio of the current induced into said standard coil to that induced into said sample coil, said output indicating the turns count of said sample coil.

8. A method of determining the turns count of a sample coil wound on an open magnetic core comprising the steps of:
    closing a magnetic circuit through the open core of said sample coil to couple said sample coil to a first primary winding turn,
    exciting said first primary winding turn with an alternating current,
    exciting a second primary winding turn coupled to a standard coil wound on a magnetic core with said current,
    producing a measurement output proportional to the ratio of the current induced into said standard coil to that induced into said sample coil, said output indicating the turns count of said sample coil.

9. A method of determining the turns count of a sample coil capable of being coupled to a magnetic circuit comprising the steps of:
    closing a magnetic circuit through said sample coil to couple said sample coil to a first primary winding turn,
    exciting said first primary winding turn with an alternating current,
    exciting a second primary winding turn coupled to a standard coil wound on a magnetic core with said current,
    producing a measurement output proportional to the ratio of the current induced into said standard coil to that induced into said sample coil, said output indicating the turns count of said sample coil.

* * * * *